US012684780B2

(12) United States Patent
Jeon et al.

(10) Patent No.: US 12,684,780 B2
(45) Date of Patent: Jul. 14, 2026

(54) MEMORY DEVICE HAVING HYDROGEN-ION BYPASS VIA ON CELL SUBSTRATE AND CONNECTED TO PAD STRUCTURE

(71) Applicant: Samsung Electronics Co., Ltd., Suwon-si (KR)

(72) Inventors: Woo Yong Jeon, Anyang-si (KR); Eun-Ji Kim, Seoul (KR); Ji Young Kim, Seoul (KR); Moo Rym Choi, Yongin-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 511 days.

(21) Appl. No.: 18/153,763

(22) Filed: Jan. 12, 2023

(65) Prior Publication Data

US 2023/0292521 A1      Sep. 14, 2023

(30) Foreign Application Priority Data

Mar. 11, 2022      (KR) ......................... 10-2022-0030769

(51) Int. Cl.
H10B 41/27          (2023.01)
H01L 23/522         (2006.01)
          (Continued)
(52) U.S. Cl.
CPC ......... H10B 43/40 (2023.02); H01L 23/5226 (2013.01); H01L 23/5283 (2013.01);
          (Continued)
(58) Field of Classification Search
CPC . H01L 23/5226; H01L 23/5283; H10B 41/10; H10B 41/27; H10B 41/35;
          (Continued)

(56) References Cited

U.S. PATENT DOCUMENTS 5,637,188 A * 6/1997 Amme et al. .................. 438/708
8,971,118 B2   3/2015 Jin et al.
          (Continued)

FOREIGN PATENT DOCUMENTS

CN          112185977 A      1/2021
KR    10-2021-0025032 A      3/2021
          (Continued)

OTHER PUBLICATIONS

Office Action in Korean Appln. No. 10-2022-0030769, mailed on Sep. 30, 2025, 12 pages (with English translation).
Notice of Allowance in Korean Appln. No. 10-2022-0030769, mailed on Apr. 21, 2026, 5 pages (with English translation).

*Primary Examiner* — Wael M Fahmy
*Assistant Examiner* — Alice W Tang
(74) *Attorney, Agent, or Firm* — Fish & Richardson P.C.

(57)          ABSTRACT

A semiconductor memory device includes a peripheral circuit structure including a peripheral circuit and a first bonding pad, the first bonding pad connected to the peripheral circuit, a cell structure on the peripheral circuit structure, the cell structure including a second bonding pad bonded to the first bonding pad, and a pad structure on the cell structure. The cell structure includes a cell substrate having a first face, a second face opposite to the first face, a first contact plug extending through the cell substrate and connected to an electrode layer, and a second contact plug extending through the cell substrate and connected to the cell substrate. Each of the first contact plug and the second contact plug is connected to the pad structure, and a bypass via is in contact with the pad structure on the second face.

20 Claims, 22 Drawing Sheets

(51) Int. Cl.

| | |
|---|---|
| *H01L 23/528* | (2006.01) |
| *H10B 41/10* | (2023.01) |
| *H10B 41/35* | (2023.01) |
| *H10B 41/40* | (2023.01) |
| *H10B 43/10* | (2023.01) |
| *H10B 43/27* | (2023.01) |
| *H10B 43/35* | (2023.01) |
| *H10B 43/40* | (2023.01) |
| *H10B 43/50* | (2023.01) |

(52) U.S. Cl.
CPC ............. *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/35* (2023.02)

(58) Field of Classification Search
CPC ........ H10B 41/40; H10B 43/10; H10B 43/27; H10B 43/35; H10B 43/40
See application file for complete search history.

(56) References Cited

U.S. PATENT DOCUMENTS

| | | | |
|---|---|---|---|
| 10,629,616 B1 * | 4/2020 | Kai et al. .......... | H01L 27/11582 |
| 10,784,217 B2 | 9/2020 | Nakajima | |
| 10,847,534 B2 | 11/2020 | Chu | |
| 11,037,945 B2 | 6/2021 | Huang et al. | |
| 11,094,704 B2 | 8/2021 | Zhang et al. | |
| 11,158,622 B1 | 10/2021 | Zhang | |
| 2007/0278560 A1 * | 12/2007 | Watanabe ..................... | 257/315 |
| 2009/0171613 A1 * | 7/2009 | Tsukazawa ................... | 702/130 |
| 2020/0203329 A1 * | 6/2020 | Kanamori et al. ...... | H01L 25/18 |
| 2020/0279841 A1 | 9/2020 | Sanuki | |
| 2020/0388630 A1 | 12/2020 | Yun et al. | |
| 2021/0134778 A1 | 5/2021 | Huang et al. | |
| 2021/0327804 A1 * | 10/2021 | Kim et al. .......... | H01L 23/5226 |

FOREIGN PATENT DOCUMENTS

| | | |
|---|---|---|
| KR | 10-2021-0053824 A | 5/2021 |
| KR | 10-2021-0075197 A | 6/2021 |

* cited by examiner

MEMORY DEVICE HAVING HYDROGEN-ION BYPASS VIA ON CELL SUBSTRATE AND CONNECTED TO PAD STRUCTURE

CROSS-REFERENCE TO RELATED APPLICATION

This application claims priority from Korean Patent Application No. 10-2022-0030769 filed on Mar. 11, 2022 in the Korean Intellectual Property Office, and all the benefits accruing therefrom under 35 U.S.C. 119, the contents of which in its entirety are herein incorporated by reference.

FIELD

The present inventive concepts relate to a semiconductor memory device and/or an electronic system including the same.

BACKGROUND

In order to meet high performance and low price of a semiconductor memory device as demanded by consumers, it is desirable or required to increase integration of the semiconductor memory device. The integration of the semiconductor memory devices is an important factor in determining a price thereof. Thus, the semiconductor memory device having increased integration is particularly desired or required.

Integration of a two-dimensional (2D) or planar semiconductor memory device is largely determined based on an occupancy area of a unit memory cell, and therefore is greatly affected by a level of a fine pattern formation skill. However, ultra-expensive equipment is desired or required for formation of fine patterns. Thus, although the integration of the 2D semiconductor memory device is increasing, the increase is limited. Accordingly, three-dimensional semiconductor memory devices including three-dimensionally arranged memory cells have been proposed.

SUMMARY

A technical purpose achieved by some of the example embodiments is to provide a semiconductor memory device with improved performance and reliability.

Another technical purpose achieved by some of the example embodiments is to provide an electronic system including a semiconductor memory device with improved performance and reliability.

Purposes according to some of the example embodiments are not limited to the above-mentioned purposes. Other purposes and advantages according to the present inventive concepts that are not mentioned may be understood based on following descriptions, and may be more clearly understood based on some example embodiments according to the present inventive concepts. Further, it will be easily understood that the purposes and advantages according to the present inventive concepts may be realized using means shown in some example embodiments According to an example embodiment of the present inventive concepts, a semiconductor memory device includes a peripheral circuit structure including a peripheral circuit and a first bonding pad, the first bonding pad connected to the peripheral circuit, a cell structure on the peripheral circuit structure, the cell structure including a second bonding pad bonded to the first bonding pad, and a pad structure on the cell structure, the cell structure including a cell substrate having a first face, a second face opposite to the first face, a first contact plug extending through the cell substrate and connected to an electrode layer, and a second contact plug extending through the cell substrate and connected to the cell substrate, wherein each of the first contact plug and the second contact plug is connected to the pad structure, and a bypass via is in contact with the pad structure on the second face According to some example embodiments of the present inventive concepts, a semiconductor memory device includes a peripheral circuit structure including a peripheral circuit and a first bonding pad, the first bonding pad connected to the peripheral circuit, a cell structure on the peripheral circuit structure, wherein the cell structure includes a second bonding pad bonded to the first bonding pad, and a connection pad electrically connected to the second bonding pad, and a pad structure on the cell structure, wherein the pad structure includes a first metal pad, a second metal pad and a third metal pad each electrically connected to the peripheral circuit structure, wherein the cell structure includes a cell substrate having a first face, a second face opposite to the first face, a channel structure extending through an electrode layer stacked on the first face of the cell substrate, a cell contact plug in a cell contact plug hole extending through the cell substrate, and a plate contact plug in a plate contact plug hole extending through the cell substrate, wherein the plate contact plug is connected to the cell substrate, a conductive via connected to the pad structure is on the second face, and the cell contact plug is connected to the electrode layer. The cell contact plug is connected to the first metal pad and the plate contact plug is connected to the second metal pad, and the first metal pad and the second metal pad are not electrically connected to each other According to some example embodiments of the present disclosure, An electronic system including a main substrate, a semiconductor memory device on the main substrate, and a controller on the main substrate and electrically connected to the semiconductor memory device. The semiconductor memory device includes a peripheral circuit structure including a peripheral circuit and a first bonding pad, the first bonding pad connected to the peripheral circuit, a cell structure on the peripheral circuit structure, the cell structure including a second bonding pad bonded to the first bonding pad, a common source plate having a first face, a second face opposite to the first face, a first contact plug extending through the common source plate and connected to an electrode layer, a second contact plug extending through the common source plate and connected to the common source plate, and a pad structure on the cell structure, the pad structure electrically connected to the peripheral circuit structure. Each of the first contact plug and the second contact plug is connected to the pad structure, and wherein a bypass via in contact with the pad structure is on the second face.

BRIEF DESCRIPTION OF DRAWINGS

The above and other aspects and features of the present inventive concepts will become more apparent by describing in detail some example embodiments thereof with reference to the attached drawings, in which:

FIG. 21 is an illustrative perspective view for illustrating an electronic system according to some example embodiments;

DETAILED DESCRIPTIONS

Figure 1:
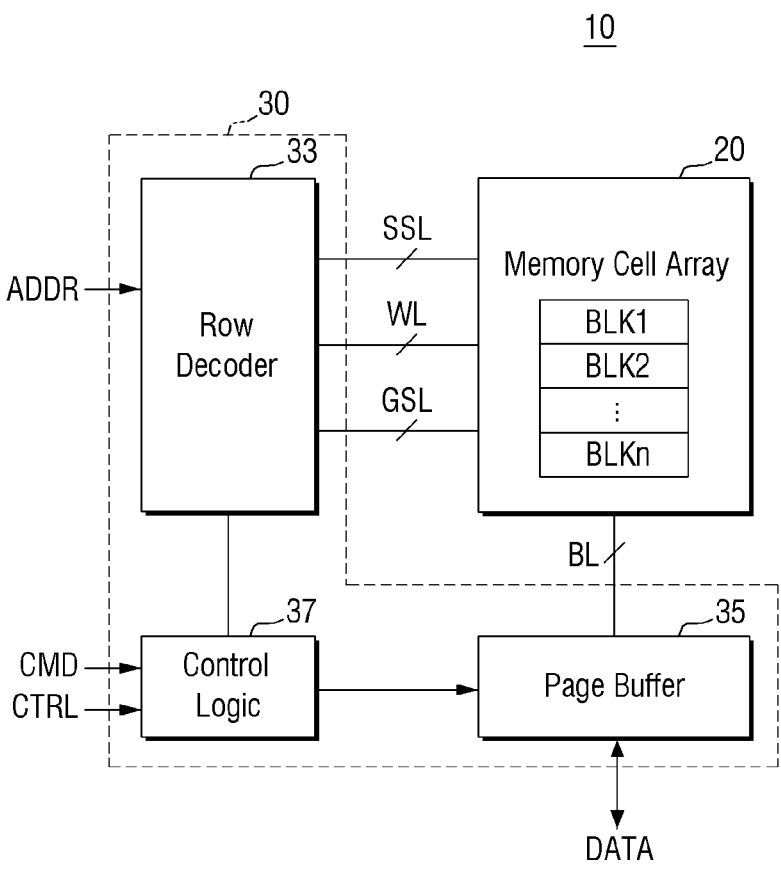
FIG. 1 is an illustrative block diagram for illustrating a semiconductor memory device according to some example embodiments.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present inventive concepts, numerous specific details are set forth in order to provide a thorough understanding of the present inventive concepts. However, it will be understood that the present inventive concepts may be practiced without these specific details. In other example embodiments, well-known methods, procedures, components, and circuits have not been described in detail so as not to unnecessarily obscure aspects of the present inventive concepts. Examples of various example embodiments are illustrated and described further below. It will be understood that the description herein is not intended to limit the claims to the specific example embodiments described. On the contrary, it is intended to cover alternatives, modifications, and equivalents as may be included within the scope of the present inventive concepts.

A shape, a size, a ratio, an angle, a number, etc. disclosed in the drawings for illustrating example embodiments of the present inventive concepts are examples, and the present inventive concepts are not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present inventive concepts. However, it will be understood that the present inventive concepts may be practiced without these specific details. In other instances, well-known methods, procedures, components, and circuits have not been described in detail so as not to unnecessarily obscure aspects of the present inventive concepts.

The terminology used herein is for the purpose of describing particular example embodiments only and is not intended to limit the present inventive concepts. As used herein, the singular forms "a" and "an" are intended to include the plural forms as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the scope of the present inventive concepts.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between and connected to the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between and connected to the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between and connected to the former and the latter. Further, as used herein, when a layer, film, region, plate, or the like may be disposed "below" or "under" another layer, film, region, plate, or the like, the former may directly contact the latter or still another layer, film, region, plate, or the like may be disposed between and connected to the former and the latter. As used herein, when a layer, film, region, plate, or the like is directly disposed "below" or "under" another layer, film, region, plate, or the like, the former directly contacts the latter and still another layer, film, region, plate, or the like is not disposed between and connected to the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain example embodiment may be implemented differently, a function or operation specified in a specific block may occur in a sequence different from that specified in a flowchart. For example, two consecutive blocks may be actually executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated. The features of the various example embodiments of the present inventive concepts may be partially or entirely combined with each other, and may be technically associated with each other or operate with each other. The example embodiments may be implemented independently of each other and may be implemented together in an association relationship.

Spatially relative terms, such as "beneath," "below," "lower," "under," "above," "upper," and the like, may be used herein for ease of explanation for illustrating one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

Terms as used herein "first direction Y", "second direction X" and "third direction Z" should not be interpreted only to have a geometric relationship in which the first direction, the second direction, and the third direction are perpendicular to each other. The "first direction Y", "second direction X" and "third direction Z" may be interpreted to have a broader direction within a range in which components herein may work functionally.

Hereinafter, some example embodiments of the present inventive concepts will be described in detail with reference to the accompanying drawings. The same reference numerals are used for the same components in the drawings, and duplicate descriptions thereof are omitted.

Hereinafter, a semiconductor memory device according to some example embodiments will be described with reference to FIG. 1 to FIG. 8.

FIG. 1 is an illustrative block diagram for illustrating a semiconductor memory device according to some example embodiments.

Referring to FIG. 1, a semiconductor memory device 10 according to some example embodiments includes a memory cell array 20 and a peripheral circuit 30.

The memory cell array 20 may include a plurality of memory cell blocks (BLK1 to BLKn). Each of the memory cell blocks BLK1 to BLKn may include a plurality of memory cells. The memory cell array 20 may be connected to the peripheral circuit 30 via a bit-line BL, a word-line WL, at least one string select line SSL, and at least one ground select line GSL. Specifically, the memory cell blocks BLK1 to BLKn may be connected to a row decoder 33 via the word-line WL, the string select line SSL, and the ground select line GSL. Further, the memory cell blocks BLK1 to BLKn may be connected to a page buffer 35 via the bit-line BL. Although not specifically illustrated, one memory cell block may be defined by two adjacent word-line cutting structures. A plurality of channel structures CH to be described later may be disposed in each memory cell block defined by the word-line cutting structures.

The peripheral circuit 30 may receive an address ADDR, a command CMD, and a control signal CTRL from an external device to the semiconductor memory device 10, and may transmit and receive data DATA to and from an external device to the semiconductor memory device 10. The peripheral circuit 30 may include a control logic 37, the row decoder 33, and the page buffer 35. Although not shown, the peripheral circuit 30 may further include various sub-circuits such as an input/output circuit, a voltage generation circuit for generating various voltages required for an operation of the semiconductor memory device 10, and an error correction circuit for correcting an error of the data DATA read from the memory cell array 20.

The control logic 37 may be connected to the row decoder 33, the input/output circuit, and the voltage generation circuit. The control logic 37 may control overall operations of the semiconductor memory device 10. The control logic 37 may generate various internal control signals used in the semiconductor memory device 10 in response to the control signal CTRL. For example, the control logic 37 may adjust a voltage level of a voltage supplied to the word-line WL and the bit-line BL when performing a memory operation such as a program operation or an erase operation.

The row decoder 33 may select at least one of the plurality of memory cell blocks BLK1 to BLKn in response to the address ADDR, and may select at least one word-line WL, at least one string select line SSL, and at least one ground select line GSL of the selected at least one memory cell block BLK1 to BLKn. Further, the row decoder 33 may transmit a voltage for performing a memory operation to the word-line WL of the selected at least one memory cell block BLK1 to BLKn.

The page buffer 35 may be connected to the memory cell array 20 via the bit-line BL. The page buffer 35 may operate as a writer driver or a sense amplifier. Specifically, when performing a program operation, the page buffer 35 operates as the writer driver to apply a voltage based on the data DATA to be stored in the memory cell array 20 to the bit-line BL. On the other hand, when performing a read operation, the page buffer 35 may operate as the sense amplifier to detect the data DATA stored in the memory cell array 20.

Figure 2:
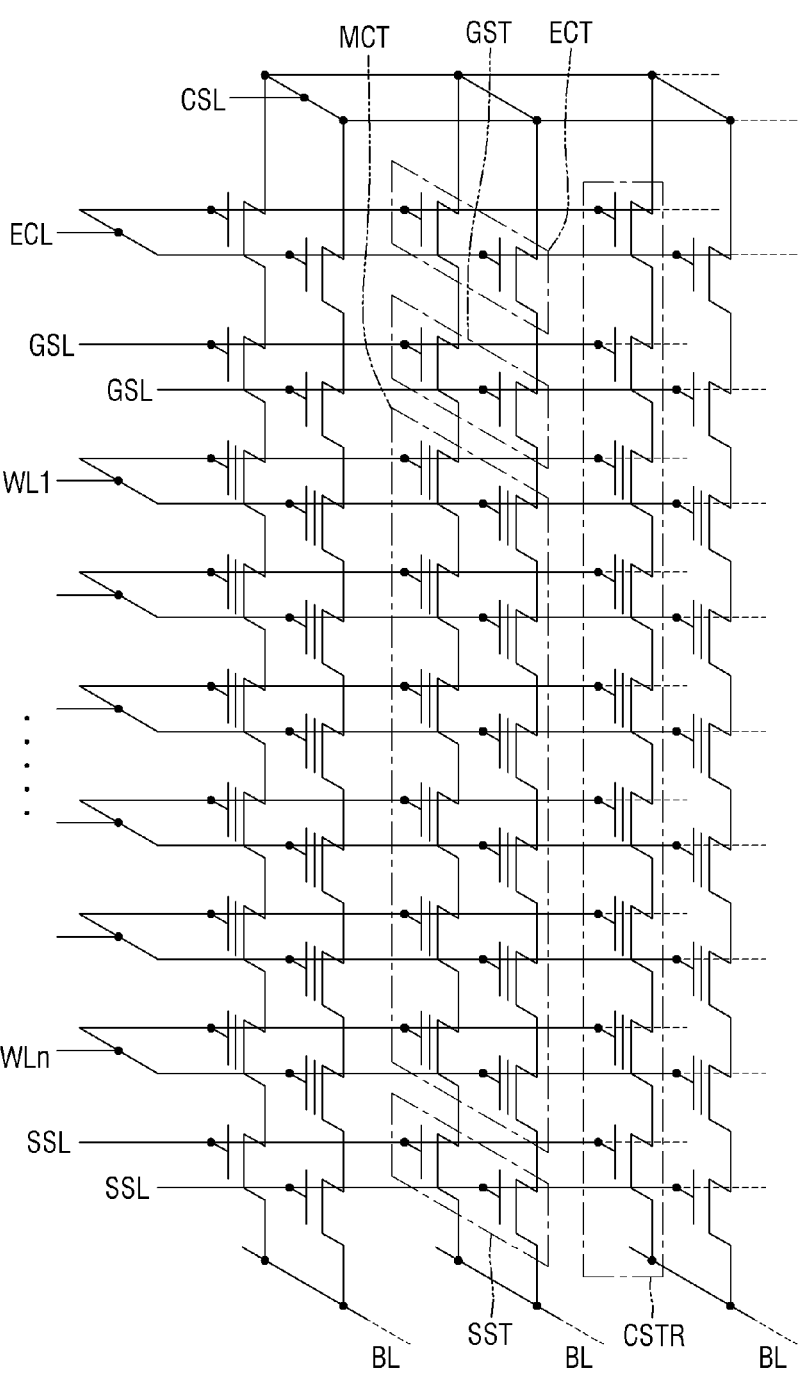
FIG. 2 is an illustrative circuit diagram for illustrating a semiconductor memory device according to some example embodiments.

FIG. 2 is an illustrative circuit diagram for illustrating a semiconductor memory device according to some example embodiments.

Referring to FIG. 2, a memory cell array (e.g., 20 in FIG. 1) of a semiconductor memory device according to some embodiments includes a common source line CSL, a plurality of bit-lines BL, and a plurality of cell strings CSTR.

The common source line CSL may extend in the first direction X. In some example embodiments, a plurality of common source lines CSL may be arranged in a two-dimensional manner. The same voltage may be applied to the common source lines CSL. Alternatively, different voltages may be individually applied to be the common source lines CSL.

The plurality of bit-lines BL may be arranged in a two-dimensional manner. The plurality of cell strings CSTR may be connected in parallel to each of the bit-lines BL. The cell strings CSTR may be connected to the common source line CSL. That is, the plurality of cell strings CSTR may be disposed between the bit-lines BL and the common source line CSL.

Each of the cell strings CSTR may include a ground select transistor GST connected to the common source line CSL, a string select transistor SST connected to the bit-line BL, and a plurality of memory cell transistors MCT disposed between the ground select transistor GST and the string select transistor SST. Each of the memory cell transistors MCT may include a data storage element. The ground select transistor GST, the string select transistor SST and the memory cell transistors MCT may be connected in series to each other.

The common source line CSL may be commonly connected to sources of the ground select transistors GST. Further, a ground select line GSL, a plurality of word-lines WL1 to WLn and a string select line SSL may be disposed between the common source line CSL and the bit-line BL. The ground select line GSL may act as a gate electrode of the ground select transistor GST. The word-lines WL1 to WLn may be respectively used as gate electrodes of the memory cell transistors MCT. The string select line SSL may act as a gate electrode of the string select transistor SST.

In some example embodiments, an erase control transistor ECT may be disposed between the common source line CSL and the ground select transistor GST. The common source line CSL may be commonly connected to sources of the erase control transistors ECT. Further, an erase control line ECL may be disposed between the common source line CSL and the ground select line GSL. The erase control line ECL may act as a gate electrode of the erase control transistor ECT. The erase control transistors ECT may generate gate induced drain leakage (GIDL) to execute an erase operation of the memory cell array.

Figure 3:
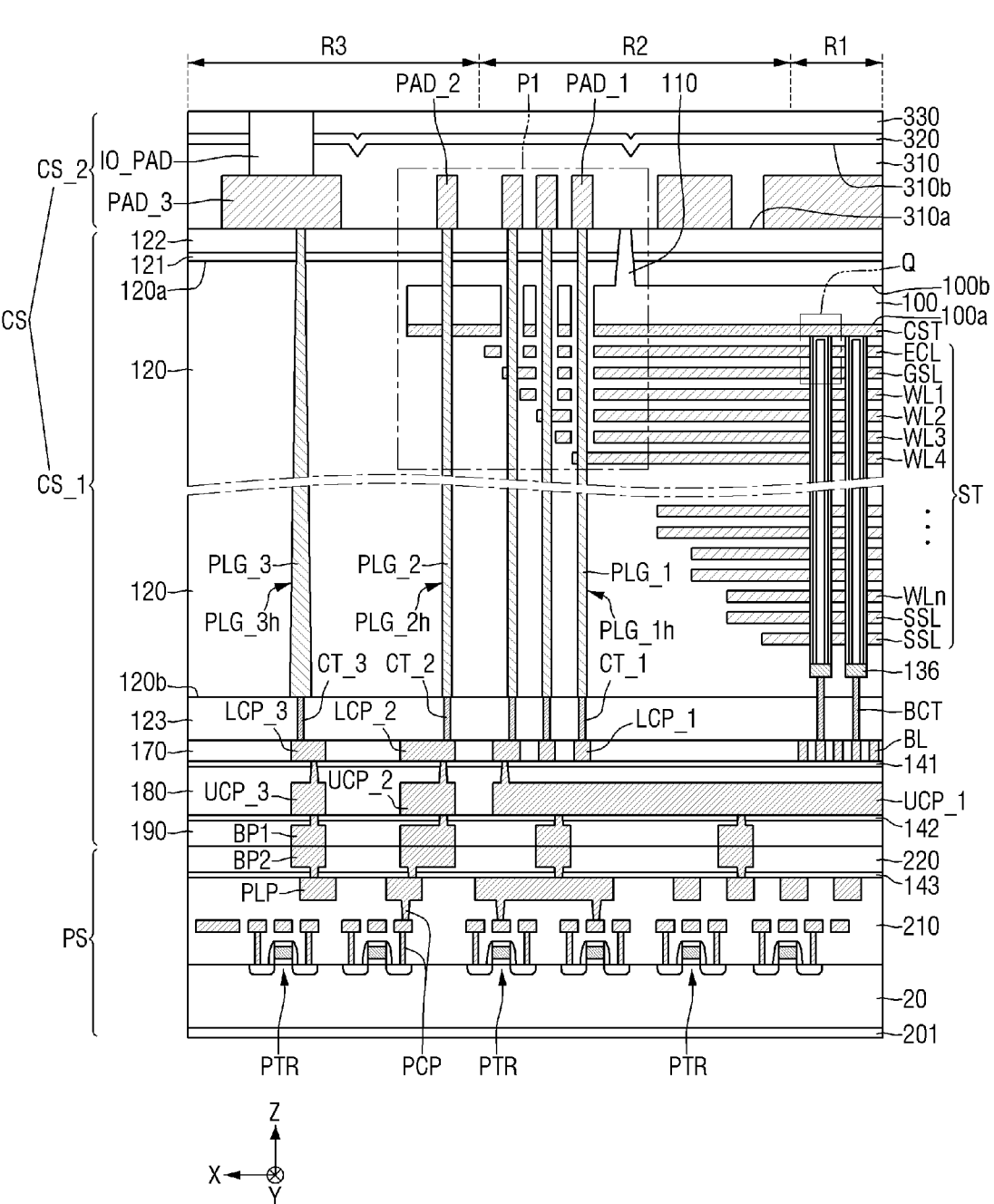
FIG. 3 is a schematic diagram for illustrating a semiconductor memory device according to some example embodiments.
Figure 4:
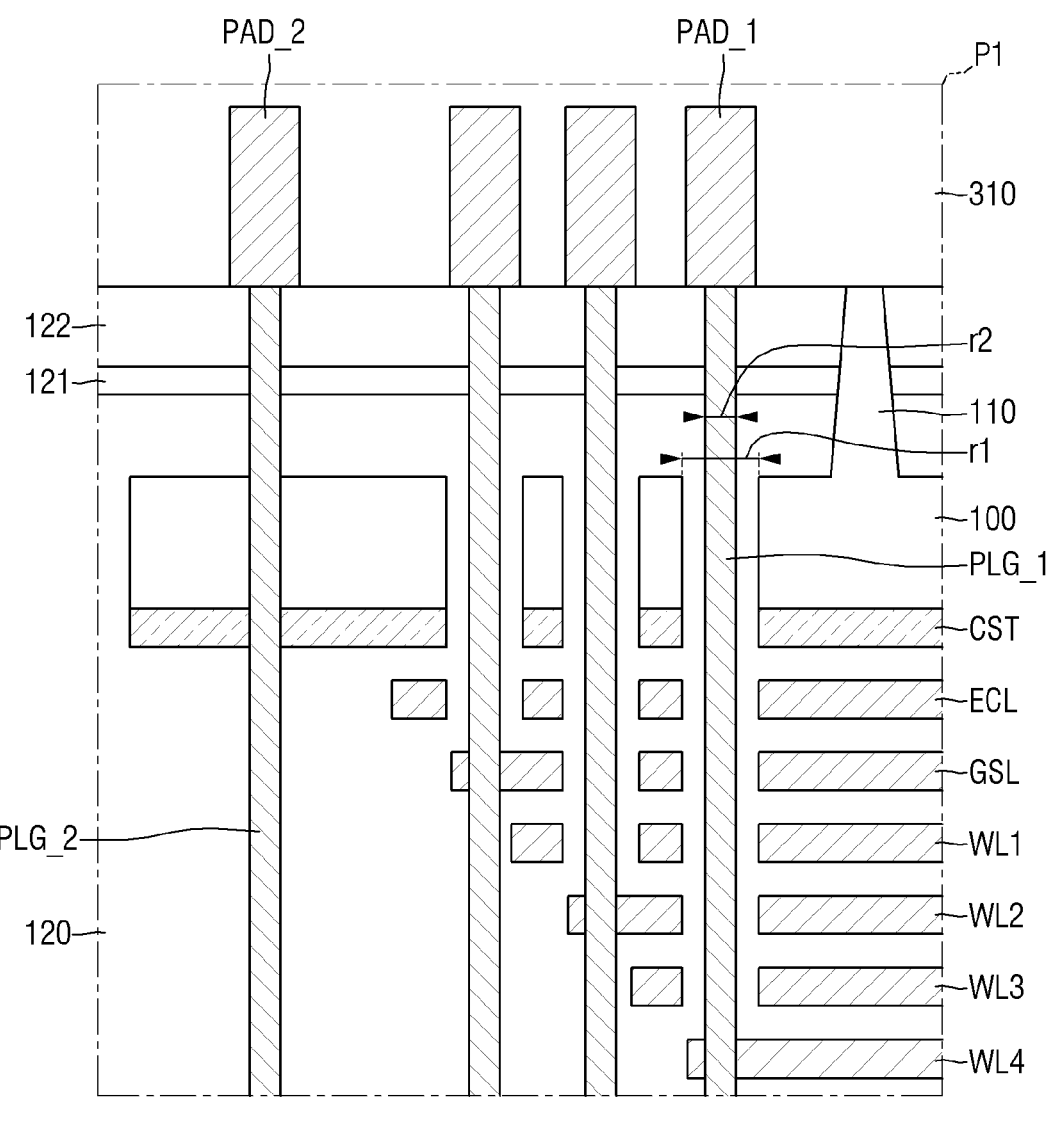
FIG. 4 is an enlarged view to illustrate a P1 area of FIG. 3.
Figure 7:
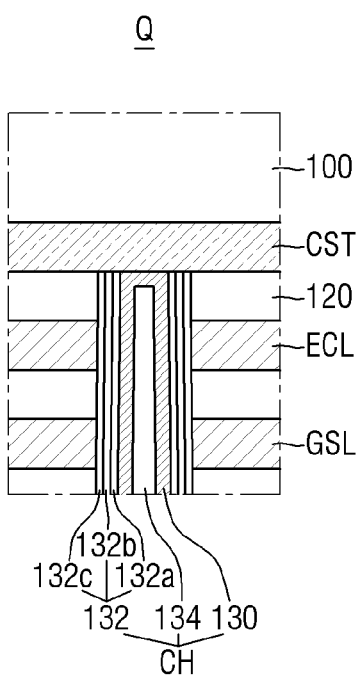
FIG. 7 is an enlarged view to illustrate a Q area of FIG. 3.

FIG. 3 is a schematic diagram for illustrating a semiconductor memory device according to some example embodiments. FIG. 4 is an enlarged view to illustrate a P1 area of FIG. 3. FIG. 7 is an enlarged view to illustrate a Q area of FIG. 3.

Referring to FIG. 3 to FIG. 4, the semiconductor memory device according to some example embodiments includes a cell array structure CS and a peripheral circuit structure PS.

The semiconductor memory device according to some example embodiments may have a C2C (chip to chip) structure. The C2C structure may be formed by manufacturing an upper chip including a first wafer and a cell structure CS_1 on the first wafer, and then manufacturing a lower chip including a second wafer different from the first wafer and a peripheral circuit structure PS on the second wafer, and then coupling the upper chip and the lower chip to each other in a bonding scheme. In some example embodiments, the bonding scheme may mean a scheme in which a bonding metal as the uppermost metal layer of the upper chip and a bonding metal as the uppermost metal layer of the lower chip are electrically connected to each other. For example, when the bonding metal is made of copper (Cu), the bonding scheme may be a (Cu)—Cu bonding scheme. Alternatively, this bonding metal may be made of aluminum or tungsten, but example embodiments are not limited thereto.

The cell array structure CS may include a cell structure CS_1 on the peripheral circuit structure and a pad structure CS_2 on the cell structure CS_1.

The cell structure CS_1 may include a memory cell array including memory cells arranged three-dimensionally and disposed on the cell substrate 100. The cell structure CS_1 may include a cell substrate 100, a stack structure ST, a channel structure CH, a first contact plug PLG_1, a second contact plug PLG_2 and a third contact plug PLG_3.

The cell array structure CS may include a cell area R1, a first connection area R2, and a second connection area R3. Channel structures CH may be arranged in the cell area RE A cell contact plug PLG_1 may be disposed in the first connection area R2. A common source plate contact plug PLG_2 and an input/output contact plug PLG_3 may be disposed in the second connection area R3.

The cell substrate 100 may act as a common source plate on which the common source line CSL is formed. For example, the cell substrate 100 may be embodied as a semiconductor substrate such as a silicon substrate, a germanium substrate, or a silicon-germanium substrate. Alternatively, the cell substrate 100 may include a silicon-on-insulator (SOI) substrate or a germanium-on-insulator (GOI) substrate, but example embodiments are not limited thereto. In some example embodiments, the cell substrate 100 may contain impurities. For example, the cell substrate 100 may contain n-type impurities e.g., phosphorus (P), arsenic (As), and the like. The cell substrate 100 may include polysilicon. In this case, the cell substrate 100 may include a conductive material.

A bypass via 110 in contact with the pad structure CS_2 may be formed on the other face 100*b* of the cell substrate 100. The bypass via 110 may extend through a third insulating film 122 to be described later and thus may contact one face 310*a* of a capping insulating film 310. Contact plug holes for forming the first to third contact plugs PLG_1, PLG_2, and PLG_3 to be described later may be formed in an etching process using high energy plasma. In this regard, charges may accumulate on the cell substrate 100 to cause arcing. However, according to some example embodiments, the bypass via 110 may prevent the charges from accumulating on the cell substrate 100, thereby suppressing the arcing. The bypass via 110 may be formed as a portion of the cell substrate 100, and may include polysilicon.

A first insulating film 120 covering a sidewall of the cell substrate 100 and a sidewall of a source structure CST may be disposed. The first insulating film 120 may be disposed on one face 100*a* and the other face 100*b* of the cell substrate 100. The first insulating film 120 may include one face 120*a* and the other face 120*b*. A second insulating film 121 to be described later may be formed on one face 120*a* of the first insulating film. The first insulating film 120 may cover the stack structure ST. The first insulating film 120 may include oxide-based insulating material. The first insulating film 120 may include, for example, at least one of silicon oxide, silicon oxynitride, and a low dielectric constant (low-k) material having a dielectric constant smaller than that of silicon oxide. However, the present inventive concepts are not limited thereto.

The second insulating film 121 may be disposed on the first insulating film 120. Each of the first to third contact plugs PLG_1, PLG_2, and PLG_3 may extend through the second insulating film 121. The second insulating film 121 may include, but is not limited to, a nitride-based insulating material.

The third insulating film 122 may be disposed on the second insulating film 121. The bypass via 110 and each of the first to third contact plugs PLG_1, PLG_2, and PLG_3 may extend through the third insulating film 122. The third insulating film 122 may include oxide-based insulating material. The third insulating film 122 may include, for example, at least one of silicon oxide, silicon oxynitride, and a low dielectric constant (low-k) material having a dielectric constant smaller than that of silicon oxide. However, the present inventive concepts are not limited thereto.

The pad structure CS_2 may include first to third metal pads PAD_1, PAD_2, and PAD_3 spaced apart from each other in the first direction X, and an input/output pad IO_PAD. The first to third metal pads PAD_L PAD_2, and PAD_3 and the input/output pad IO_PAD may be disposed on the third insulating film 122. Each of the first to third metal pads PAD_1, PAD_2, and PAD_3 may include, for example, aluminum. However, the present inventive concepts are not limited thereto.

The capping insulating film 310 may be disposed on the third insulating film 122. The capping insulating film 310 may cover the first to third metal pads PAD_1, PAD_2, and PAD_3, and at least a portion of the input/output pad IO_PAD. The capping insulating film 310 includes one face 310*a* and the other face 310*b* facing each other.

A protective film 320 and a passivation layer 330 may be sequentially formed on the other face 310*b* of the capping insulating film 310. The protective film 320 may be, for example, a silicon nitride film or a silicon oxynitride film. The passivation layer 330 may be made of, for example, a polyimide-based material such as photosensitive polyimide (PSPI). Each of the capping insulating film 310, the protective film 320, and the passivation layer 330 may have a pad opening exposing a portion of the third metal pad PAD_3. The input/output pad IO_PAD may fill the pad opening.

The stack structure ST may be disposed on the source structure CST. The stack structure ST may include gate electrodes ECL, GSL, and WL1 to WLn, SSL stacked along the third direction Z perpendicular to a plane defined by the first and second directions X and Y intersecting each other. Although not specifically shown, the stack structure ST may include the gate electrodes ECL, GSL, and WL1 to WLn, and SSL and insulating films which area alternately stacked with each other. Each of the gate electrodes ECL, GSL, and WL1 to WLn, and SSL may include, for example, at least one selected from doped semiconductors such as doped silicon, metals such as tungsten, copper, aluminum, etc., conductive metal nitrides such as titanium nitride, tantalum nitride or the like, or transition metal such as titanium, tantalum, etc., but example embodiments are not limited thereto. Each of the insulating films may include a silicon oxide film and/or a low dielectric film.

The gate electrodes ECL, GSL, and WL1 to WLn, and SSL may be stacked on the source structure CST and in the first connection area R2 so as to have a stepped structure. The gate electrodes ECL, GSL, and WL1 to WLn, SSL may be connected to the cell contact plug PLG_1 to be described later.

The channel structure CH may be disposed in the stack structure ST and in the cell area RE The channel structure CH may extend through the stack structure ST in the third direction Z that intersects with one face 100*a* of the cell substrate. For example, the channel structure CH may have a filler pillar shape (for example, a cylindrical shape) extending in the third direction Z. Accordingly, the channel structure CH may intersect each of the gate electrodes ECL, GSL, and WL1 to WLn, and SSL.

Referring to FIG. 7, the channel structure CH may include a semiconductor pattern 130 and an information storage film 132.

The semiconductor pattern 130 may extend through the stack structure ST in the third direction Z. The semiconductor pattern 130 is shown as having a shape of a cup. However, this is only illustrative. For example, the semiconductor pattern 130 may have various shapes, such as a cylindrical shape, a rectangular cylindrical shape, and a solid pillar shape. The semiconductor pattern 130 may include, but is not limited to, semiconductor materials such as single crystal silicon, polycrystalline silicon, organic semiconductor materials, and carbon nano structures.

The information storage film 132 may be interposed between the semiconductor pattern 130 and each of the gate electrodes ECL, GSL, and WL1 to WLn, and SSL. For example, the information storage film 132 may extend along an outer face of the semiconductor pattern 130. The information storage film 132 may include, for example, at least one of silicon oxide, silicon nitride, silicon oxynitride, and a high dielectric constant material having a dielectric constant greater than that of silicon oxide. The high dielectric constant material may include, for example, at least one of aluminum oxide, hafnium oxide, lanthanum oxide, tantalum oxide, titanium oxide, lanthanum hafnium oxide, lanthanum aluminum oxide, dysprosium scandium oxide, and combinations thereof, but example embodiments are not limited thereto.

In some example embodiments, a plurality of channel structures CH may be arranged in a zigzag shape. The plurality of channel structures CH arranged in the zigzag shape may further improve integration of the semiconductor memory device. In some example embodiments, the plurality of channel structures CH may be arranged in a honeycomb manner. The number of the channel structures CH disposed in each memory cell block may vary.

In some example embodiments, the information storage film 132 may be composed of a multilayer. For example, the information storage film 132 may include a tunnel insulating film 132*a*, a charge storage film 132*b*, and a blocking insulating film 132*c* that are sequentially stacked on an outer face of the semiconductor pattern 130.

The tunnel insulating film 132*a* may include, for example, silicon oxide or a high dielectric constant material having a higher dielectric constant than that of silicon oxide. The high dielectric constant material may include aluminum oxide ($Al_2O_3$), and hafnium oxide ($HfO_2$). The charge storage film 132*b* may include, for example, silicon nitride. The blocking insulating film 132*c* may include, for example, silicon oxide or a high dielectric constant material having a higher dielectric constant than that of silicon oxide. The high dielectric constant material may include aluminum oxide ($Al_2O_3$), and hafnium oxide ($HfO_2$), but example embodiments are not limited thereto.

In some example embodiments, the channel structure CH may further include a filling pattern 134. The filling pattern 134 may be formed to fill or substantially fill an inside of the cup-shaped semiconductor pattern 130. The filling pattern 134 may include an insulating material, for example, silicon oxide. However, the present inventive concepts are not limited thereto.

In some embodiments, the channel structure CH may further include a channel pad 136. The channel pad 136 may be formed to be connected to the semiconductor pattern 130. For example, the channel pad 136 may be disposed in the first insulating film 120 so as to be connected to a top of the semiconductor pattern 130. The channel pad 136 may include, for example, polysilicon doped with impurities. However, the present inventive concepts are not limited thereto.

In some example embodiments, the source structure CST may be disposed on the cell substrate 100. The source structure CST may be formed on one face 100*a* of the cell substrate. The source structure CST may be interposed between the cell substrate 100 and the stack structure ST. For example, the source structure CST may extend along and on one face 100*a* of the cell substrate.

In some example embodiments, the source structure CST may be formed to be connected to the semiconductor pattern 130 of the channel structure CH. For example, as shown in FIG. 7, one face of the source structure CST may contact one face of the semiconductor pattern 130. The source structure CST may be disposed on the semiconductor pattern 130. This source structure CST may act as the common source line (e.g., CSL of FIG. 2) of the semiconductor memory device. The source structure CST may include, for example, impurities-doped polysilicon or metal. However, the present inventive concepts are not limited thereto.

Although not shown, a base insulating film may be interposed between the cell substrate 100 and the source structure CST. The base insulating film may include, for example, at least one of silicon oxide, silicon nitride, and silicon oxynitride. However, the present inventive concepts are not limited thereto.

The bit-line BL may be formed on the stack structure ST and the first insulating film 120. The bit-line BL may be connected to each of the plurality of channel structures CH. For example, a bit-line contact BCT connected to a top of each of the channel structures CH may be formed in the first insulating film 120. The bit-line BL may be electrically connected to each of the channel structures CH via the bit-line contact BCT.

The cell contact plug PLG_1 may be disposed in the first connection area R2. The cell contact plug PLG_1 may extend from the first connection area R2 in the third direction Z and then may extend through the first insulating film 120. For convenience of illustration, it is illustrated that there are three cell contact plugs PLG_1. However, the present inventive concepts are not limited thereto.

Each of the cell contact plugs PLG_1 may be connected to each of the gate electrodes ECL, GSL, and WL1 to WLn, and SSL and may be disposed in the first connection area R2. Specifically, one of the gate electrodes ECL, GSL, and WL1 to WLn, and SSL may be connected to one cell contact plugs PLG_1. That is, each of the remaining gate electrodes ECL, GSL, and WL1 to WLn, and SSL that are not connected to said one cell contact plug PLG_1 may be spaced from said one cell contact plug PLG_1. In this case, an insulating material may be formed in a space therebetween.

The cell contact plug PLG_1 extends through the cell substrate 100 and is not connected to the cell substrate 100. Accordingly, referring to FIG. 4, in an area through which the cell contact plug PLG_1 extends the cell substrate 100, a diameter r1 of a hole formed in the cell substrate 100 may be larger than a diameter r2 of a cell contact plug hole PLG_1*h*.

The cell contact plug PLG_1 may include conductive material.

The cell contact plug PLG_1 may include, for example, a metal such as tungsten (W), cobalt (Co), or nickel (Ni). However, a type of the metal is not limited thereto. For example, the cell contact plug PLG_1 may include tungsten (W).

The cell contact plug PLG_1 may be electrically connected to the bit-line BL via a cell contact CT_1. The cell contact CT_1 may include conductive material. For example, the cell contact CT_1 may include, but is not limited to, tungsten (W) or copper (Cu).

The common source plate contact plug PLG_2 extends through the cell substrate 100 and is connected to the cell substrate 100 and the source structure CST. The common source plate contact plug PLG_2 may be made of a conductive material such as metal, metal compound, or polysilicon, and may be electrically connected to the source structure CST.

The common source plate contact plug PLG_2 may be electrically connected to a second lower connection pad LCP_2 via a source contact CT_2. The source contact CT_2 may include conductive material. The source contact CT_2 may include, for example, tungsten (W) or copper (Cu). However, the present inventive concepts are not limited thereto.

Each of the cell contact plug PLG_1 and the common source plate contact plug PLG_2 may be spaced apart from the bypass via 110. In this case, each of the cell contact plug PLG_1 and the common source plate contact plug PLG_2 may bypass the bypass via 110 and be connected to the pad structure CS_2. Specifically, the cell contact plug PLG_1 is connected to the first metal pad PAD_1 of the pad structure CS_2. The cell contact plug PLG_1 directly contacts the first metal pad PAD_1. The common source plate contact plug PLG_2 is connected to the second metal pad PAD_2 of the pad structure CS_2. The common source plate contact plug PLG_2 directly contacts the second metal pad PAD_2.

The input/output contact plug PLG_3 may extend through the first insulating film 120 and thus be electrically connected to the third metal pad PAD_3 and the input/output pad IO_PAD. The input/output contact plug PLG_3 may be disposed in the second connection area R3. In some example embodiments, the cell substrate 100 and the source structure CST may not be disposed in an area where the input/output contact plug PLG_3 is disposed. Further, the input/output pad IO_PAD may not overlap the gate electrodes ECL, GSL, and WL1 to WLn, and SSL in the third direction Z.

The cell contact CT_1, the source contact CT_2, and an input/output contact CT_3 may be disposed on a fourth insulating film 123 on the other face 120*a* of the first insulating film. The first to third lower connection pads LCP_1, LCP_2, and LCP_3 may be disposed on a fifth insulating film 170 on the fourth insulating film 123.

The first lower connection pad LCP_1 may be connected to the cell contact plug PLG_1 via the cell contact CT_1. The second lower connection pad LCP_2 may be connected to the common source plate contact plug PLG_2 via the source contact CT_2. The third lower connection pad LCP_3 may be connected to the input/output contact plug PLG_3 via the input/output contact CT_3.

A first upper connection pad UCP_1 may be disposed on a sixth insulating film 180 and may be electrically connected to the first lower connection pad LCP_1. A second upper connection pad UCP_2 may be disposed on the sixth insulating film 180 and may be electrically connected to the second lower connection pad LCP_2. A third upper connection pad UCP_3 may be disposed on the sixth insulating film 180 and may be electrically connected to the third lower connection pad LCP_3.

Each of the first to third lower connection pads LCP_1, LCP_2, and LCP_3 and the first to third upper connection pads UCP_1, UCP_2, and UCP_3 may include, for example, at least one selected from metals such as tungsten, copper, aluminum, etc., conductive metal nitrides such as titanium nitride, tantalum nitride or the like, or transition metals such as titanium, tantalum, etc., but example embodiments are not limited thereto.

In the cell structure CS_1, first bonding pads BP1 may be disposed in a seventh insulating film 190. The first bonding pads BP1 may be electrically connected to the first to third lower connection pads LCP_1, LCP_2, and LCP_3 and the first to third upper connection pads UCP_1, UCP_2, and UCP_3. Each of the first bonding pads BP1 may be made of aluminum, copper, or tungsten, but example embodiments are not limited thereto.

As the common source plate contact plug PLG_2 extends through the cell substrate 100 and contacts the second metal pad PAD_2, the second metal pad PAD_2, the common source plate contact plug PLG_2 and the cell substrate 100 may constitute a first path through which hydrogen ions ($H^+$) travel. As the cell contact plug PLG_1 extends through the cell substrate 100 and contacts the first metal pad PAD_1, the first metal pad PAD_1, the cell contact plug PLG_1 and the first lower connection pad LCP_1 may constitute a second path through which hydrogen ions ($H^+$) travel. In this case, the first and second metal pads PAD_1 and PAD_2 are spaced apart from each other and are not electrically connected to each other. That is, the first path and the second path may be independent paths that are not connected to each other.

According to the semiconductor memory device according to some example embodiments, the number of the paths as channels of the hydrogen ions ($H^+$) may be increased compared to that in the prior art. As a result, efficiency of a process for curing the cell area R1 may be improved.

The peripheral circuit structure PS may include a semiconductor substrate 20, and peripheral circuits PTR controlling the memory cell array, and eighth and ninth insulating films 210 and 220 covering the peripheral circuits PTR which may be formed on the semiconductor substrate 20. The peripheral circuits PTR may be integrated on a top face of the semiconductor substrate 20. A surface insulating film 201 may be disposed on a back face of the semiconductor substrate 20.

The peripheral circuits PTR may act as the row and column decoders, the page buffer, and the control logic. A peripheral circuit element PT may include, for example, a transistor. However, the present inventive concepts are not limited thereto. For example, the peripheral circuit element PT may include not only various active element such as transistors, but also various passive elements such as capacitors, resistors, and inductors.

Peripheral circuit lines PLP may be electrically connected to the peripheral circuits PTR via peripheral contacts PCP.

Each of the eighth and ninth insulating films 210 and 220 may be disposed on the top face of the semiconductor substrate 20. The eighth and ninth insulating films 210 and 220 may cover the peripheral circuits PTR, the peripheral contacts PCP, and the peripheral circuit lines PLP while being disposed on the semiconductor substrate 20. The peripheral contact plugs PCP and the peripheral circuit lines PLP may be electrically connected to the peripheral circuits PTR. Each of the eighth and ninth insulating films 210 and

220 may include a silicon oxide film, a silicon nitride film, a silicon oxynitride film, and/or a low dielectric constant film, but example embodiments are not limited thereto.

Second bonding pads BP2 may be disposed in the ninth insulating film 220 so as to correspond to the first bonding pads BP1. The second bonding pads BP2 may be electrically connected to the peripheral circuits PTR via the peripheral circuit lines PLP and the peripheral contacts PCP. The second bonding pads BP2 may be electrically and physically connected to the first bonding pads BP1 in a bonding scheme. That is, the second bonding pads BP2 may directly contact the first bonding pads BP1, respectively. Each of the second bonding pads BP2 may include the same metal material as that of each of the first bonding pads BP1. Each of the second bonding pads BP2 may have substantially the same shape, the same width, or the same area size as that of each of the first bonding pads BP1.

A plurality of insulating films 141, 142, and 143 may be respectively formed between the first to third lower connection pads LCP_1, LCP_2, and LCP_3 and the first to third upper connection pads UCP_1, UCP_2, and UCP_3, between the first to third upper connection pads UCP_1, UCP_2, and UCP_3 and the first bonding pads BP1, and between the second bonding pads BP2 and the peripheral circuit lines PLP. Each of the plurality of insulating films 141, 142, and 143 may include, but is not limited to, a nitride-based insulating material.

Figure 5:
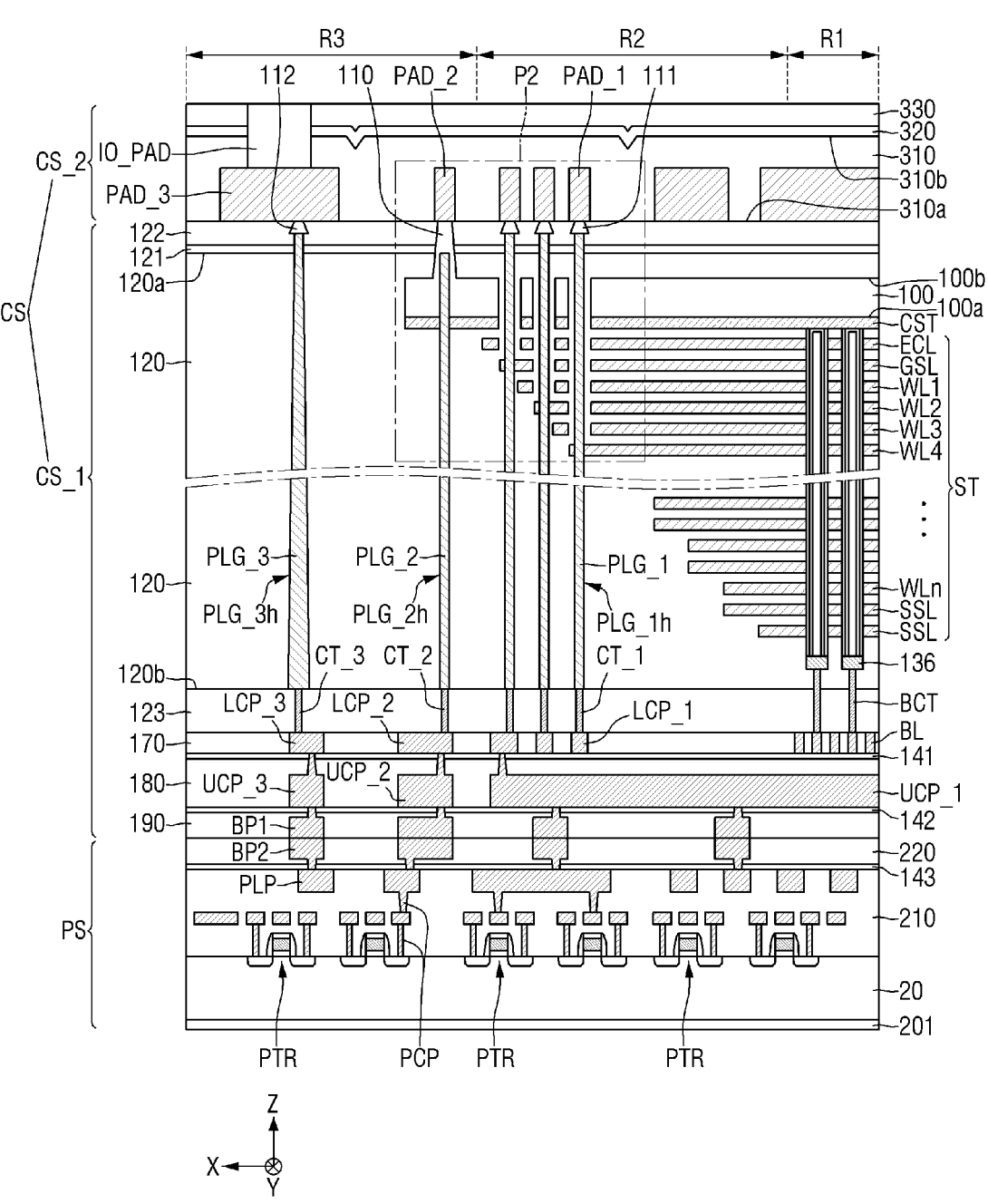
FIG. 5 is a schematic diagram for illustrating a semiconductor memory device according to some example embodiments.
Figure 6:
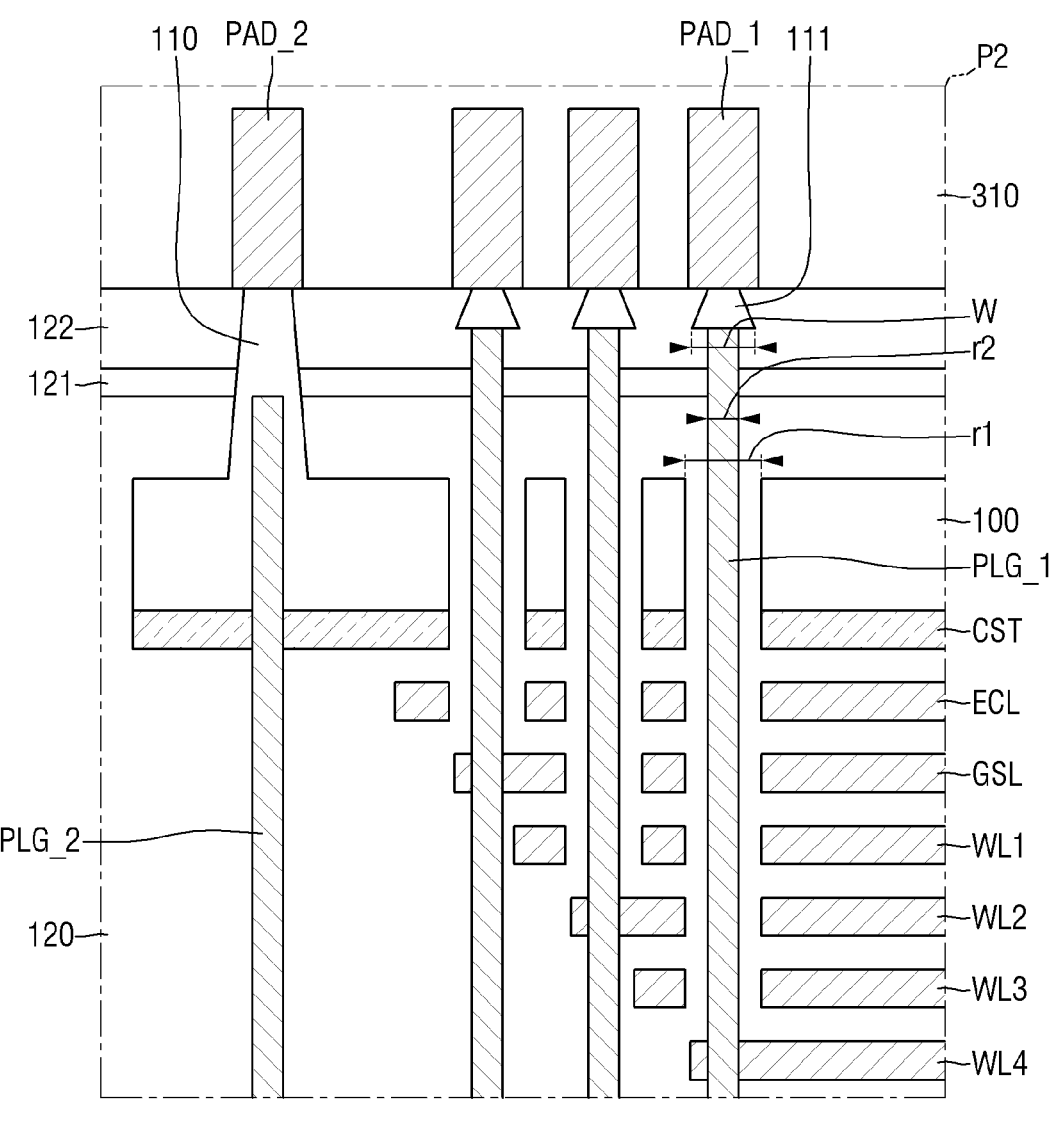
FIG. 6 is an enlarged view to illustrate a P2 area of FIG. 5.

FIG. 5 is a schematic diagram for illustrating a semiconductor memory device according to some example embodiments. FIG. 6 is an enlarged view to illustrate a P2 area of FIG. 5. For convenience of description, contents duplicate with those described using FIG. 1 to FIG. 4 and FIG. 7 are simply described or omitted.

Referring to FIG. 5, the common source plate contact plug PLG_2 is electrically connected to the pad structure CS_2 via the bypass via 110. The cell contact plug PLG_1 is in contact with a first conductive pad 111 spaced apart from the other face 100b of the cell substrate in the third direction Z. The input/output contact plug PLG_3 contacts a second conductive pad 112 spaced apart from the cell substrate 100.

Referring to FIG. 6, a width W of the first conductive pad 111 may be decreased as the pad 111 extends toward the first metal pad PAD_1 of the pad structure CS_2. This structure may be due to a method of forming the first conductive pad 111 by etching the cell substrate 100, as will be described later.

Further, a length of the common source plate contact plug PLG_2 extending from the other face 120b of the first insulating film and into the bypass via 110 in the third direction Z may be smaller than a length of the cell contact plug PLG_1 extending from the other face 120b of the first insulating film 120 and into the third insulating layer 122 in the third direction Z. This structure may be due to different etch rates of polysilicon and oxide, as will be described later.

Figure 8:
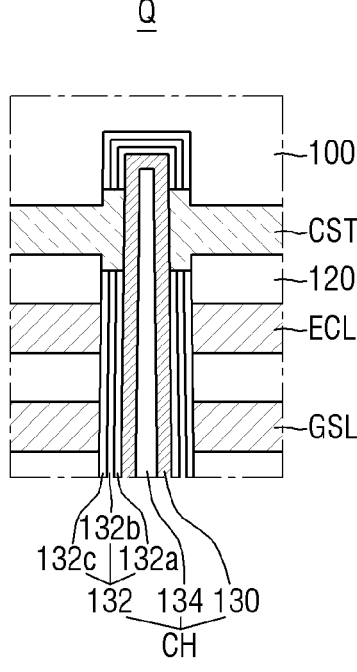
FIG. 8 is a diagram for illustrating a semiconductor memory device according to some example embodiments, and is a diagram corresponding to FIG. 7.

FIG. 8 is a diagram for illustrating a semiconductor memory device according to some example embodiments, and is a diagram corresponding to FIG. 7. For convenience of description, contents duplicate with the descriptions using FIG. 1 to FIG. 7 are simply described or omitted.

Referring to FIG. 8, the source structure CST may extend through the information storage film 132 and thus contact the semiconductor pattern 130. A side face of the semiconductor pattern 130 may be in contact the source structure CST. Even in some example embodiments, the source structure CST may act as the common source line (e.g., CSL of FIG. 2) of the semiconductor memory device.

Although not shown, a source support layer may be disposed on the source structure CST. The source support layer may act as a support layer to prevent collapse of fall-down of a mold stack in a replacement process to form the source structure CST.

FIG. 9 to FIG. 13 are diagrams of intermediate structures of steps for illustrating a method for manufacturing a semiconductor memory device according to some example embodiments. FIG. 9 to FIG. 13 are diagrams to illustrate a method for manufacturing the semiconductor memory device as described using FIG. 4. For convenience of description, contents duplicate with those as described using FIG. 1 to FIG. 5 and FIG. 8 are simply described or omitted.

Figure 9:
FIG. 9, FIG. 10, FIG. 11, FIG. 12 and FIG. 13 are diagrams of intermediate structures of steps for illustrating a method for manufacturing a semiconductor memory device according to some example embodiments.

Referring to FIG. 9, a first_first insulating film 120A is formed on a silicon substrate SUB. The silicon substrate SUB may be removed later.

Figure 10:

Referring to FIG. 10, the first_first insulating film 120A is etched to form a first via hole 110$h$_1 where the bypass via 110 will be formed.

Figure 11:
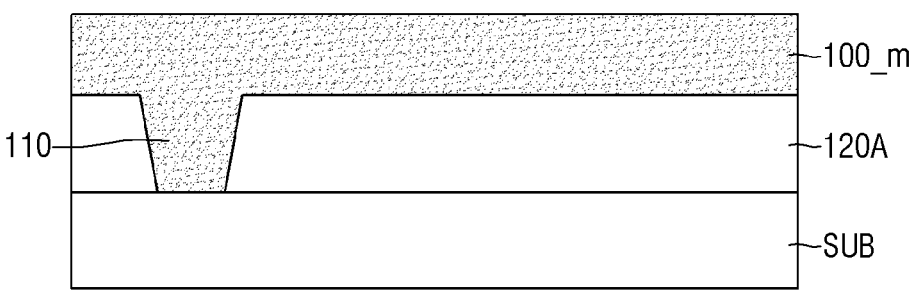

Referring to FIG. 11, a polysilicon layer 100_$m$ is formed on the first_first insulating film 120A, and an inside of the first via hole 110$h$_1 is filled with the polysilicon layer 100_$m$. In this way, the bypass via 110 and the cell substrate 100 may be formed.

Figure 12:
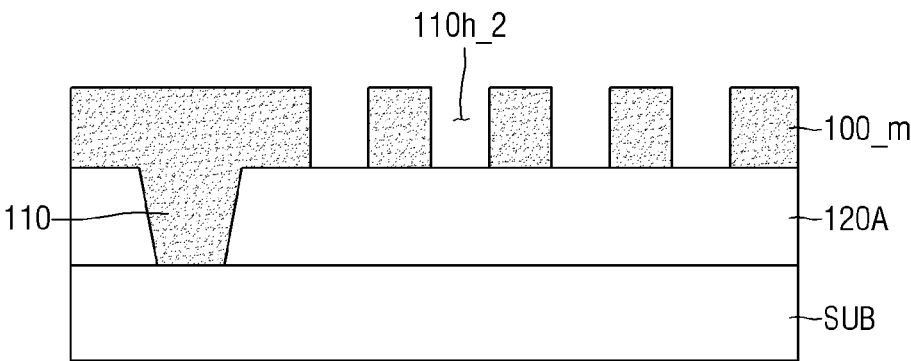

Referring to FIG. 12, a second via hole 110$h$_2 is formed by pre-etching a portion of the polysilicon layer 100_$m$. Thus, the cell substrate 100 may be pre-patterned.

Figure 13:
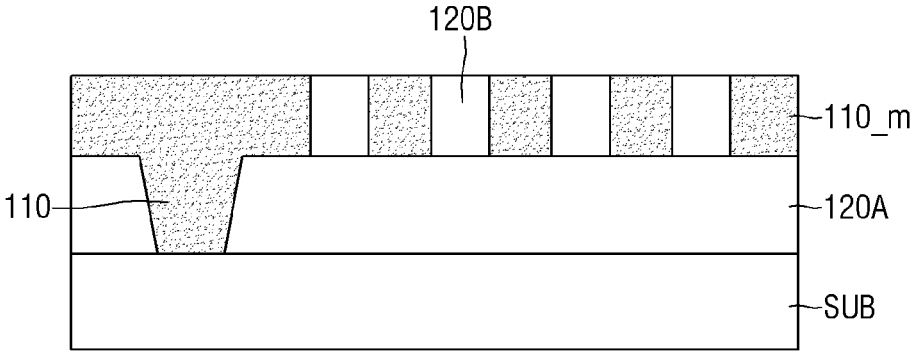

Referring to FIG. 13, a first_second insulating film 120B is formed in the second via hole 110$h$_2.

Then, referring to FIG. 4, each of a cell contact plug hole PLG_1$h$ and a common source plate contact plug hole PLG_2$h$ extending through a combination of the cell substrate 100, the first_first insulating film 120A, and the first_second insulating film 120B is formed. At this time, an input/output contact plug hole PLG_3$h$ where the input/output contact plug PLG_3 will be formed and a channel hole (not shown) where the channel structure CH will be formed may be formed simultaneously or substantially simultaneously.

Although not specifically illustrated, a dummy channel structure may be formed in the stack structure ST and in the first connection area R2 so as to reduce stress as applied thereto. According to some example embodiments, the cell contact plug hole PLG_1$h$, the common source plate contact plug hole PLG_2$h$, the input/output contact plug hole PLG_3$h$, the channel hole and a dummy channel hole in which the dummy channel structure will be formed may be formed so as to be communicate with each other, such that the number of processes may be further reduced.

Thereafter, the cell contact plug PLG_1 is formed in the cell contact plug hole PLG_1$h$, and the common source plate contact plug PLG_2 is formed in the common source plate contact plug hole PLG_2$h$. The input/output contact plug PLG_3 may be formed in the input/output contact plug hole PLG_3$h$, and the channel structure CH may be formed in the channel hole.

Then, the first bonding pad BP1 and the second bonding pad BP2 are bonded to each other such that the cell structure CS_1 and the peripheral circuit structure PS are bonded to each other. Thereafter, the silicon substrate SUB is removed, and the first to third metal pads PAD_1, PAD_2, and PAD_3 of the pad structure CS_2 are formed.

FIG. 14 to FIG. 19 are diagrams of intermediate structures of steps for illustrating a method for manufacturing a semiconductor memory device according to some example embodiments. FIG. 14 to FIG. 19 are diagrams to illustrate a method for manufacturing the semiconductor memory device as described using FIG. 5. For convenience of description, contents duplicate with the descriptions using FIG. 1 to FIG. 13 are simply described or omitted.

Figure 14:
FIG. 14, FIG. 15, FIG. 16, FIG. 17, FIG. 18 and FIG. 19 are diagrams of intermediate structures of steps for illustrating a method for manufacturing a semiconductor memory device according to some example embodiments.

Referring to FIG. 14, a first_third insulating film 120C is formed on the silicon substrate SUB.

Figure 15:
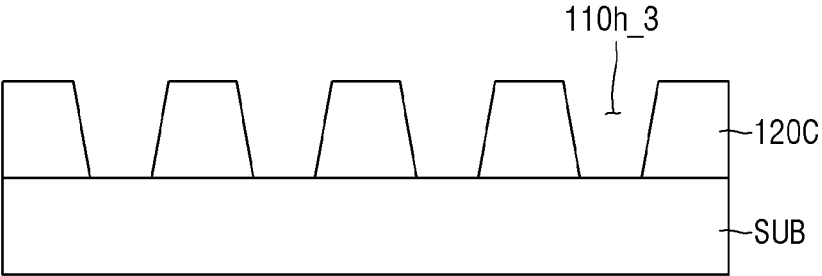

Referring to FIG. 15, the first_third insulating film 120C is etched to form a third via hole 110$h$_3 where the bypass via 110 will be formed.

Figure 16:
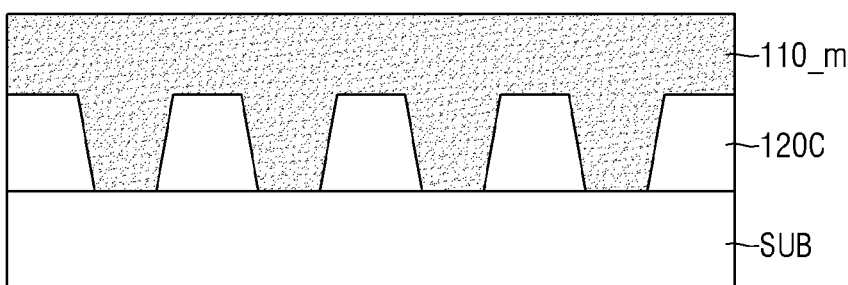

Referring to FIG. 16, the polysilicon layer 100_$m$ is formed on the first_third insulating film 120C, and an inside of the third via hole 110$h$_3 is filled with the polysilicon layer 100_$m$. In this way, the bypass via 110 and the cell substrate 100 may be formed.

Figure 17:
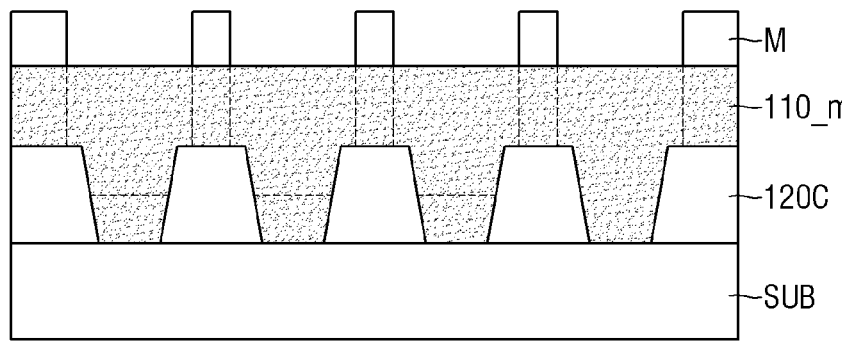

Referring to FIG. 17, a patterned mask M is formed on the polysilicon layer 100_$m$.

Figure 18:
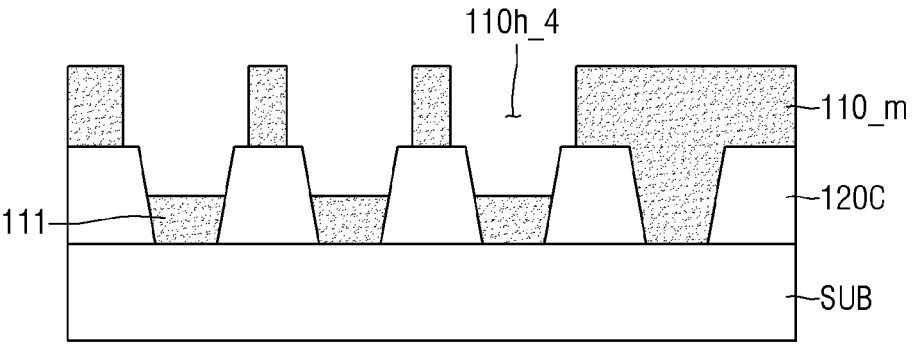

Referring to FIG. 18, the polysilicon 100_$m$ is patterned using the mask M and a fourth via hole 110$h$_4 is formed. Then, the mask M is removed.

In this case, a vertical dimension of the polysilicon layer 100_$m$ in the first_third insulating film 120C may be adjusted by adjusting a vertical dimension by which the polysilicon layer 100_$m$ is etched. The conductive via and the conductive pad 111 are formed by remaining the polysilicon layer 100_$m$ in the first_third insulating film 120C.

Figure 19:
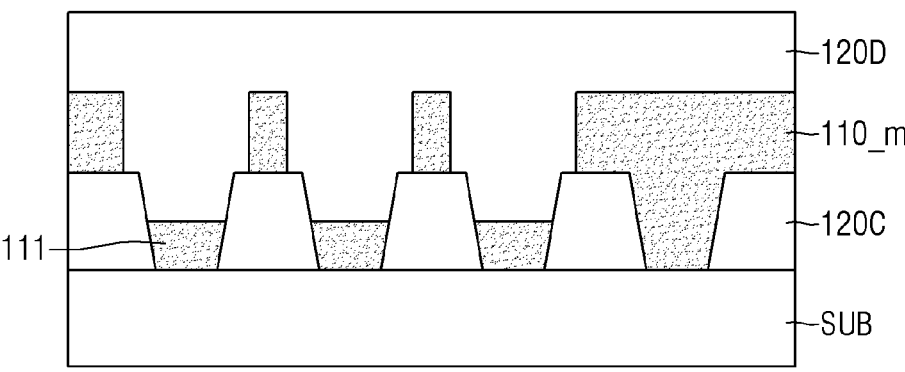

Referring to FIG. 19, a first_fourth insulating film 120D is formed in the fourth via hole 110$h$_4.

Thereafter, each of the cell contact plug hole PLG_1$h$ and the common source plate contact plug hole PLG_2$h$ extending through a combination of the cell substrate 100 and the first_fourth insulating film 120D is formed. At this time, the input/output contact plug hole PLG_3$h$ where the input/output contact plug PLG_3 will be formed and the channel hole where the channel structure CH will be formed may be formed simultaneously or substantially simultaneously.

In this case, the conductive pad 111 may function as a stopper when the cell contact plug PLG_1 and the common source plate contact plug PLG_2 are formed.

In some example embodiments, vertical lengths of the cell contact plug hole PLG_1$h$ and the common source plate contact plug hole PLG_2$h$ may be different from each other due to different etch rates of the oxide or nitride layer and the polysilicon layer 100_$m$. That is, the length in the third direction Z of the common source plate contact plug PLG_2 extending into the bypass via 110 may be smaller than the length in the third direction Z of the cell contact plug PLG_1 formed in the first insulating film 120.

Figure 20:
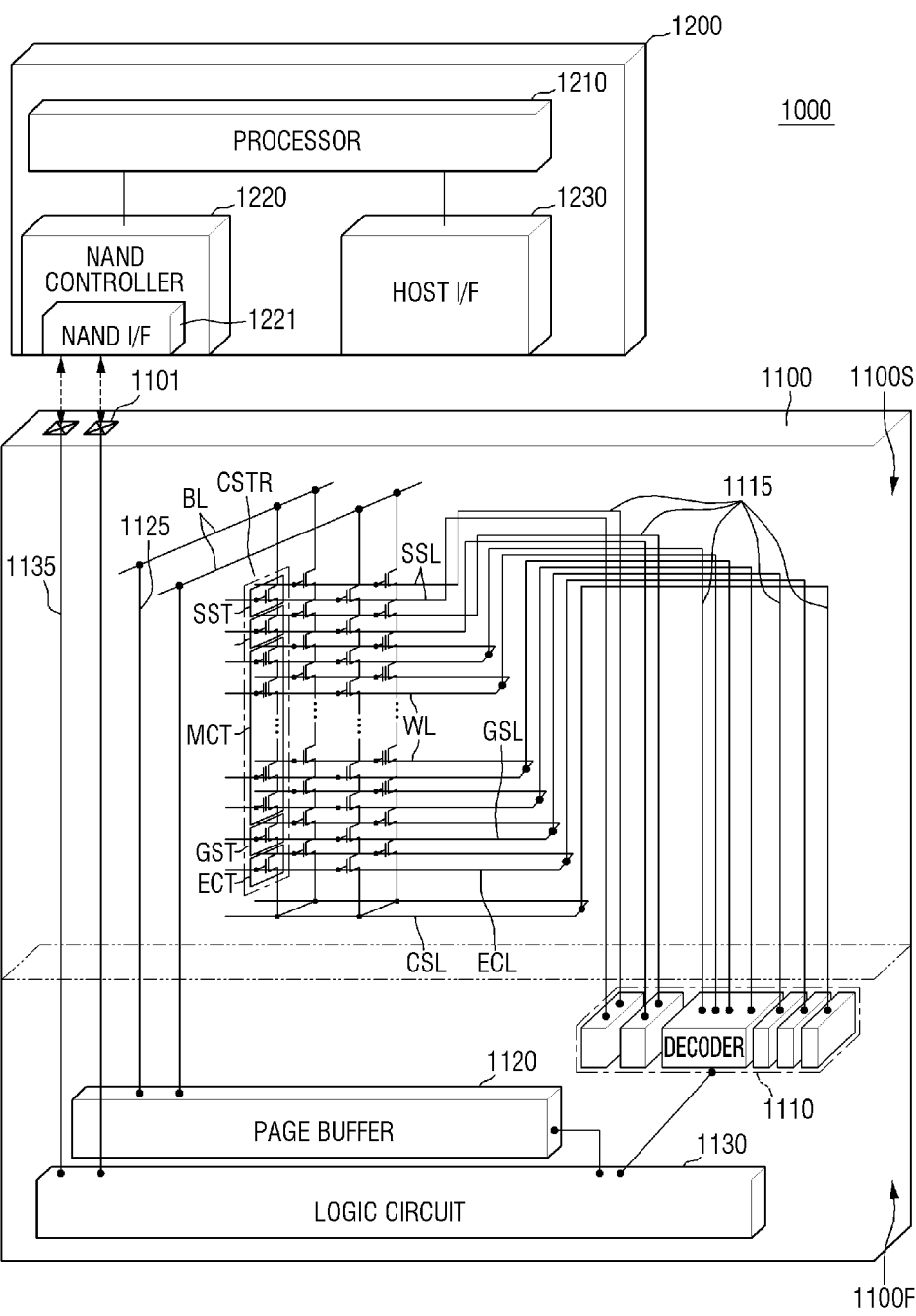
FIG. 20 is an illustrative block diagram for illustrating an electronic system according to some example embodiments.
Figure 21:
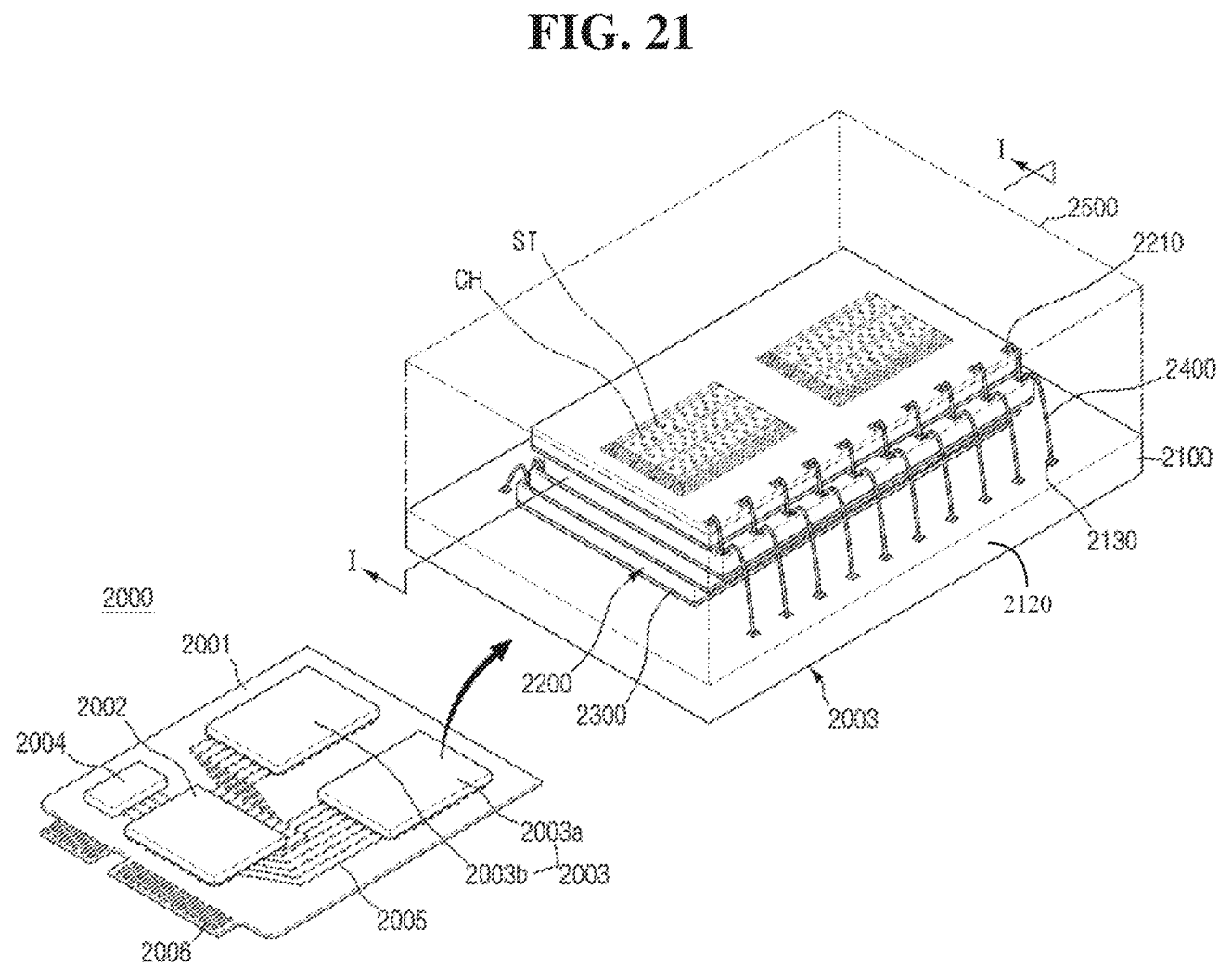
Figure 22:
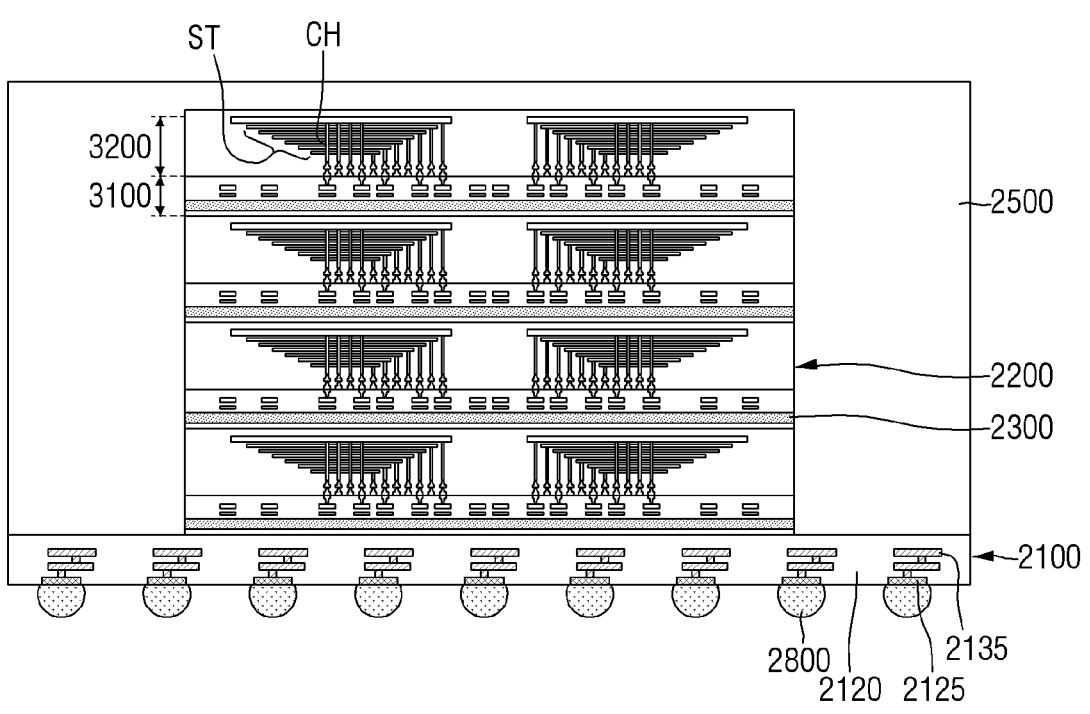
FIG. 22 is a schematic cross-sectional view taken along a line I-I in FIG. 21.

FIG. 20 is an illustrative block diagram for illustrating an electronic system according to some example embodiments. FIG. 21 is an illustrative perspective view for illustrating an electronic system according to some embodiments. FIG. 22 is a schematic cross-sectional view taken along a line I-I in FIG. 21.

Referring to FIG. 20, an electronic system 1000 according to some example embodiments may include a semiconductor memory device 1100 and a controller 1200 electrically connected to the semiconductor memory device 1100. The electronic system 1000 may be a storage device including one or a plurality of semiconductor memory devices 1100 or an electronic device including the storage device. For example, the electronic system 1000 may be embodied as a solid state drive device (SSD), a Universal Serial Bus (USB), a computing system, a medical device, or a communication device including one or a plurality of semiconductor memory devices 1100.

The semiconductor memory device 1100 may be embodied, for example, as a NAND flash memory device and may include, for example, the semiconductor memory device as described above with reference to FIGS. 1 to 8. The semiconductor memory device 1100 may include a first structure 1100F and a second structure 1100S on the first structure 1100F.

The first structure 1100F may be a peripheral circuit structure including a decoder circuit 1110 (for example, the row decoder 33 in FIG. 1), the page buffer 1120 (for example, the page buffer 35 in FIG. 1), and a logic circuit 1130 (for example, the control logic 37 of FIG. 1).

The second structure 1100S may include the common source line CSL, the plurality of bit-lines BL, and the plurality of cell strings CSTR as described above with reference to FIG. 2. The cell strings CSTR may be connected to the decoder circuit 1110 via the word-line WL, at least one string select line SSL, and at least one ground select line GSL. Further, the cell strings CSTR may be connected to the page buffer 1120 via the bit-lines BL.

In some embodiments, the common source line CSL and the cell strings CSTR may be electrically connected to the decoder circuit 1110 via first connection lines 1115 extending from the first structure 1100F to the second structure 1100S.

In some embodiments, the bit-lines BL may be electrically connected to the page buffer 1120 via second connection lines 1125 extending from the first structure 1100F to the second structure 1100S.

The semiconductor memory device 1100 may communicate with the controller 1200 via an input/output pad 1101 electrically connected to the logic circuit 1130 (e.g., the control logic 37 in FIG. 1). The input/output pad 1101 may be electrically connected to the logic circuit 1130 via an input/output connection line 1135 extending from the first structure 1100F to the second structure 1100S.

The controller 1200 may include a processor 1210, a NAND controller 1220, and a host interface 1230. In some example embodiments, the electronic system 1000 may include a plurality of semiconductor memory devices 1100. In this case, the controller 1200 may control the plurality of semiconductor memory devices 1100.

The processor 1210 may control overall operations of the electronic system 1000 including the controller 1200. The processor 1210 may operate based on predefined firmware, and may control the NAND controller 1220 to access the semiconductor memory device 1100. The NAND controller 1220 may include a NAND interface 1221 that processes communication with the semiconductor memory device 1100. Via the NAND interface 1221, a control command for controlling the semiconductor memory device 1100, data to be written to memory cell transistors MCT of the semiconductor memory device 1100, and data to be read from the memory cell transistors MCT of the semiconductor memory device 1100 may be transmitted. The host interface 1230 may provide a communication function between the electronic system 1000 and an external host. Upon receiving a control command from an external host via the host interface 1230, the processor 1210 may control the semiconductor memory device 1100 in response to the control command.

Referring to FIG. 21, an electronic system according to some embodiments may include a main substrate 2001, a main controller 2002 mounted on the main substrate 2001, at least one semiconductor package 2003, and at least one DRAM 2004. The semiconductor package 2003 and he DRAM 2004 may be connected to the main controller 2002 via line patterns 2005 formed on the main substrate 2001.

The main substrate 2001 may include a connector 2006 including a plurality of pins coupled to an external host. The number and an arrangement of the plurality of pins in the connector 2006 may vary based on a communication interface between the electronic system 2000 and the external host. In some example embodiments, the electronic system 2000 may communicate with the external host using one of interfaces such as USB (Universal Serial Bus), PCI-Express (Peripheral Component Interconnect Express), SATA (Serial Advanced Technology Attachment), M-Phy for UFS (Universal Flash Storage), etc. In some example embodiments, the electronic system 2000 may operate using power supplied from the external host via the connector 2006. The electronic system 2000 may further include a power management integrated circuit (PMIC) for distributing power supplied from the external host to the main controller 2002 and the semiconductor package 2003.

The main controller 2002 may write data to the semiconductor package 2003 or read data from the semiconductor package 2003, and may improve an operating speed of the electronic system 2000.

The DRAM 2004 may act as a buffer memory for reducing a difference between operation speeds of the semiconductor package 2003 as a data storage space and the external host. The DRAM 2004 included in electronic system 2000 may operate as a cache memory, and may provide a space for temporarily storing data therein in a control operation of the semiconductor package 2003. When the DRAM 2004 is included in the electronic system 2000, the main controller 2002 may further include a DRAM controller for controlling the DRAM 2004 in addition to a NAND controller for controlling the semiconductor package 2003.

The semiconductor package 2003 may include a first semiconductor package 2003a and a second semiconductor package 2003b spaced apart from each other. Each of the first semiconductor package 2003a and the second semiconductor package 2003b may be embodied as a semiconductor package including a plurality of semiconductor chips 2200. Each of the first semiconductor package 2003a and the second semiconductor package 2003b may include a package substrate 2100, semiconductor chips 2200 on the package substrate 2100, adhesive layers 2300 disposed on a bottom face of each of the semiconductor chips 2200, a connection structure 2400 electrically connecting the semiconductor chips 2200 and the package substrate 2100 to each other, and a molding layer 2500 disposed the package substrate 2100 and covering the semiconductor chips 2200 and the connection structure 2400.

The package substrate 2100 may be embodied as a printed circuit board including package upper pads 2130. Each semiconductor chip 2200 may include an input/output pad 2210. The input/output pad 2210 may correspond to the input/output pad 1101 in FIG. 20. Each of the semiconductor chips 2200 may include memory blocks and channel structures. The memory blocks may correspond to the memory blocks described above using, for example, FIG. 1 to FIG. 8. The channel structures may correspond to the channel structure CH as described above using, for example, FIG. 1 to FIG. 8. Each of the semiconductor chips 2200 may include, for example, the semiconductor memory device described above using FIG. 1 to FIG. 8.

In some example embodiments, the connection structure 2400 may be embodied as a bonding wire that electrically connects the input/output pad 2210 and the package upper pads 2130 to each other. Accordingly, in each of the first semiconductor package 2003a and the second semiconductor package 2003b, the semiconductor chips 2200 may be electrically connected to each other in a bonding wire scheme, and may be electrically connected to the package upper pads 2130 of the package substrate 2100. In some example embodiments, in each of the first semiconductor package 2003*a* and the second semiconductor package 2003*b*, the semiconductor chips 2200 may be electrically connected to each other via a connection structure including a through electrode (e.g., a Through Silicon Via: TSV) instead of the connection structure 2400 using the bonding wire scheme.

In some example embodiments, the main controller 2002 and the semiconductor chips 2200 may be included in one package. In some example embodiments, the main controller 2002 and the semiconductor chips 2200 may be mounted on a separate interposer substrate different from the main substrate 2001, and the main controller 2002 and the semiconductor chips 2200 may be connected to each other via a line formed in the interposer substrate.

Referring to FIG. 22, in the semiconductor package 2003, the package substrate 2100 may be embodied as a printed circuit board. The package substrate 2100 may include a package substrate body 2120, the package upper pads (2130 in FIG. 21) disposed on a top face of the package substrate body 2120, package lower pads 2125 disposed on a bottom face of the package substrate body 2120, or exposed through the bottom face thereof, and internal lines 2135 disposed in the package substrate body 2120 so as to electrically connect the upper pads 2130 and the lower pads 2125 to each other. The upper pads 2130 may be electrically connected to the connection structures 2400. The lower pads 2125 may be connected to the line patterns 2005 of the main substrate 2001 of the electronic system 2000 via conductive connectors 2800 as shown in FIG. 22.

Each of the semiconductor chips 2200 may include a semiconductor substrate and a first structure 3100 and a second structure 3200 which are sequentially stacked on the semiconductor substrate. The first structure 3100 may include, for example, the semiconductor substrate 20 as described above using FIG. 1 to FIG. 8. The second structure 3200 includes, for example, the cell substrate 100, the first to third contact plugs PLG_1, PLG_2, and PLG_3 and the first to third metal pads PAD_1, PAD_2, and PAD_3 as described above using FIG. 1 to FIG. 8. Further, the second structure 3200 may include the stack structure ST and the channel structure CH.

In some example embodiments, each of the semiconductor chips 2200 may include the first structure 3100 and the second structure 3200 bonded to each other in a wafer bonding scheme. For example, as shown, the first bonding pad BP_1 and the second bonding pad BP_2 may be electrically connected to each other in a copper-copper (Cu to Cu) bonding process.

The semiconductor chips 2200 may be electrically connected to each other via bonding wire-type connection structures (2400 in FIG. 21). However, this is only illustrative. The semiconductor chips 2200 in one semiconductor package may be electrically connected to each other via a connection structure including a through electrode (e.g., Through Silicon Via: TSV).

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Although some example embodiments of the present inventive concepts have been described with reference to the accompanying drawings, the present inventive concepts are not limited to the above example embodiments, and may be implemented in various different forms. A person skilled in the art may appreciate that the present inventive concepts may be practiced in other concrete forms without changing the technical characteristics of the present inventive concepts. Therefore, it should be understood that the example embodiments as described above are illustrative in all respects and not restrictive.

What is claimed is:

1. A semiconductor memory device comprising:
a peripheral circuit structure including a peripheral circuit and a first bonding pad, the first bonding pad connected to the peripheral circuit;
a cell structure on the peripheral circuit structure, the cell structure including a second bonding pad bonded to the first bonding pad; and
a pad structure on the cell structure,
wherein the cell structure includes (i) a cell substrate having a first face and a second face opposite to the first face, (ii) a first contact plug extending through the cell substrate and connected to an electrode layer, (iii) a second contact plug extending through the cell substrate and connected to the cell substrate, and (iv) a bypass via that comprises polysilicon, that is in contact with the pad structure, and that is on the second face of the cell substrate, and
wherein each of the first contact plug and the second contact plug is connected to the pad structure.

2. The device of claim 1, wherein each of the first contact plug and the second contact plug bypasses the bypass via and is in direct contact with the pad structure.

3. The device of claim 1, wherein the second contact plug is electrically connected to the pad structure via the bypass via, and the first contact plug is in contact with a conductive pad spaced apart from the second face of the cell substrate.

4. The device of claim 3, wherein a width of the conductive pad decreases as the conductive pad extends toward the pad structure.

5. The device of claim 1, wherein the cell structure further includes a connection pad electrically connected to the second bonding pad, and the pad structure includes a first metal pad and a second metal pad spaced apart from each other, and a third metal pad electrically connected to an input/output pad.

6. The device of claim 5, wherein the first contact plug is connected to the first metal pad and the second contact plug is connected to the second metal pad.

7. The device of claim 5, wherein the second metal pad, the second contact plug and the cell substrate define a first path of hydrogen ions, and the first metal pad, the first contact plug and the connection pad define a second path of hydrogen ions different from the first path.

8. The device of claim 5, wherein the cell structure further includes a third contact plug electrically connected to the first metal pad and the input/output pad.

9. The device of claim 1, wherein the electrode layer includes a stack of a plurality of electrode layers, and the first contact plug is connected to one of the electrode layers and is not connected to the cell substrate.

10. The device of claim 1, wherein the cell structure further includes a channel structure extending through the electrode layer, and the electrode layer is stacked on the first face of the cell substrate.

11. A semiconductor memory device comprising:

a peripheral circuit structure including a peripheral circuit and a first bonding pad, the first bonding pad connected to the peripheral circuit;

a cell structure on the peripheral circuit structure, wherein the cell structure includes a second bonding pad bonded to the first bonding pad, and a connection pad electrically connected to the second bonding pad; and a pad structure on the cell structure, wherein the pad structure includes a first metal pad, a second metal pad and a third metal pad each electrically connected to the peripheral circuit structure, wherein the cell structure includes (i) a cell substrate having a first face and a second face opposite to the first face, (ii) a channel structure extending through an electrode layer stacked on the first face of the cell substrate, (iii) a cell contact plug in a cell contact plug hole extending through the cell substrate, (iv) a plate contact plug in a plate contact plug hole extending through the cell substrate and (v) a conductive via that is connected to the pad structure and that is on the second face of the cell substrate, wherein the plate contact plug is connected to the cell substrate, and the cell contact plug is connected to the electrode layer, wherein the cell contact plug is connected to the first metal pad and the plate contact plug is connected to the second metal pad, and wherein the first metal pad and the second metal pad are not electrically connected to each other.

12. The device of claim 11, wherein each of the cell contact plug and the plate contact plug bypasses the conductive via and contacts the pad structure.

13. The device of claim 11, wherein the plate contact plug is electrically connected to the pad structure via the conductive via, and the cell contact plug is in contact with a conductive pad spaced apart from the second face of the cell substrate.

14. The device of claim 13, wherein each of the cell substrate, the conductive via, and the conductive pad includes polysilicon.

15. The device of claim 11, wherein the first metal pad, the cell contact plug and the connection pad define a first path of hydrogen ions, and the second metal pad, the plate contact plug and the cell substrate define a second path of hydrogen ions different from the first path.

16. The device of claim 11, wherein the cell structure further includes an input/output contact plug electrically connected to the third metal pad and an input/output pad.

17. An electronic system comprising:

a main substrate;

a semiconductor memory device on the main substrate; and a controller on the main substrate and electrically connected to the semiconductor memory device, wherein the semiconductor memory device includes a peripheral circuit structure including a peripheral circuit and a first bonding pad, the first bonding pad connected to the peripheral circuit;

a cell structure on the peripheral circuit structure, the cell structure including (i) a second bonding pad bonded to the first bonding pad, (ii) a common source plate having a first face and a second face opposite to the first face, (iii) a first contact plug extending through the common source plate and connected to an electrode layer, (iv) a second contact plug extending through the common source plate and connected to the common source plate, and (v) a bypass via that comprises polysilicon and that is on the second face of the common source plate; and a pad structure on the cell structure, the pad structure electrically connected to the peripheral circuit structure, wherein the bypass via is in contact with the pad structure, wherein each of the first contact plug and the second contact plug is connected to the pad structure.

18. The system of claim 17, wherein each of the first contact plug and the second contact plug bypasses the bypass via and is in contact with the pad structure.

19. The system of claim 17, wherein the second contact plug is electrically connected to the pad structure via the bypass via, and the first contact plug is in contact with a conductive pad spaced apart from the second face of the common source plate.

20. The system of claim 17, wherein the cell structure further includes a connection pad electrically connected to the second bonding pad, the pad structure includes a first metal pad, a second metal pad and a third metal pad each electrically connected to the peripheral circuit structure, wherein the first metal pad, the second metal pad and the third metal pad are spaced apart from each other, the first contact plug is connected to the first metal pad and the second contact plug is connected to the second metal pad, the first metal pad, the first contact plug and the connection pad define a first path of hydrogen ions, and
the second metal pad, the second contact plug, and the common source plate define a second path of hydrogen ions different from the first path.

* * * * *